(12) United States Patent
Pinneo

(10) Patent No.: US 6,919,525 B2
(45) Date of Patent: Jul. 19, 2005

(54) THERMAL MANAGEMENT COMPONENTS (75) Inventor: John M. Pinneo, Portola Valley, CA (US)

(73) Assignee: P1 Diamond, Inc., Santa Clara, CA (US)

(*) Notice: Subject to any disclaimer, the term of this patent is extended or adjusted under 35 U.S.C. 154(b) by 38 days.

(21) Appl. No.: 10/034,356

(22) Filed: Dec. 27, 2001

(65) Prior Publication Data
US 2002/0141155 A1 Oct. 3, 2002

Related U.S. Application Data (62) Division of application No. 09/698,516, filed on Oct. 27, 2000.
(60) Provisional application No. 60/162,429, filed on Oct. 28, 1999.

(51) Int. Cl.[7] .............................................. B23K 10/00
(52) U.S. Cl. ........................... 219/121.38; 219/121.41; 219/121.43; 427/249.8; 29/840.03; 361/705
(58) Field of Search ......................... 219/121.38, 121.4, 219/121.41, 121.43, 121.54; 427/249.8, 249.13, 577, 569; 29/840.03; 118/723 R, 723 E, 723 I; 361/720, 705; 156/646.1, 643.1

(56) References Cited

U.S. PATENT DOCUMENTS

| | | | |
|---|---|---|---|
| 4,914,551 A | 4/1990 | Anschel et al. ............. 361/398 |
| 5,146,314 A | 9/1992 | Pankove ....................... 357/82 |
| 5,365,409 A | 11/1994 | Kwon et al. ................. 361/813 |
| 5,455,457 A | 10/1995 | Kurokawa ................... 357/712 |
| 5,523,121 A | * 6/1996 | Anthony et al. ............ 427/249 |
| 5,587,013 A | * 12/1996 | Ikegaya et al. ............. 117/105 |
| 5,696,665 A | 12/1997 | Nagy ......................... 361/723 |
| 5,777,847 A | 7/1998 | Tokuno et al. .............. 361/705 |
| 5,791,045 A | * 8/1998 | Yamamoto et al. .......... 165/85 |
| 5,969,950 A | 10/1999 | Tantoush ..................... 361/704 |
| 6,001,432 A | * 12/1999 | Yamazaki et al. .......... 427/577 |
| 6,091,603 A | 7/2000 | Daves et al. ................ 361/704 |
| 6,162,412 A | * 12/2000 | Fujimori et al. ......... 427/249.8 |
| 6,165,612 A | 12/2000 | Misra ......................... 428/344 |
| 6,211,463 B1 | * 4/2001 | Fabis ......................... 361/720 |
| 6,222,263 B1 | 4/2001 | Sherif et al. ................ 257/704 |
| 6,316,826 B1 | 11/2001 | Yamamoto et al. ......... 257/705 |
| 6,509,124 B1 | * 1/2003 | Noguchi et al. ............... 430/5 |

FOREIGN PATENT DOCUMENTS

GB      2260340     * 4/1993

OTHER PUBLICATIONS

J.E. Butler et al., "Developments in CVD–Diamond Synthesis During the Past Decade", MRS Bulletin, vol. 23, No. 9, pp. 22–27, Sep. 1998.

* cited by examiner

Primary Examiner—Mark Paschall
(74) Attorney, Agent, or Firm—Sierra Patent Group, Ltd.

(57) ABSTRACT

An article comprises a heat source, a heat sink, and a high-efficiency diamond material interposed between and thermally coupled to the heat source and the heat sink. The heat source and the high-efficiency diamond material have a contact area greater than 1 square centimeter.

21 Claims, 5 Drawing Sheets

THERMAL MANAGEMENT COMPONENTS

RELATED APPLICATIONS

This application is a divisional of U.S. patent application Ser. No. 09/698,516, filed Oct. 27, 2000, which claims priority from U.S. Provisional Application Ser. No. 60/162,429, filed Oct. 28, 1999.

BACKGROUND OF THE INVENTION

1. Field of the Invention

The present invention relates to the use of economically feasible diamond materials thermal management of heat-generating systems. More particularly, the present invention relates to the use of economically feasible diamond materials for thermal management of heat-generating systems including active electronic devices such as integrated circuits.

2. The Prior Art

Active electronic devices such as transistors, laser diodes, vacuum tubes, and other electron control components generate waste heat as a common and necessary result of their operation. For purposes of this application, active electronic device is meant to encompass any device that consumes electrical energy and transforms a portion of that energy to heat.

Depending on the specifics of the device, said specifics including its geometry, power dissipation, duty cycle, material, and operational requirements, the waste heat generated may constrain the device performance in an unacceptable manner or to an unacceptable degree. For example, in laser diodes, the extreme power density necessary to excite laser emission from the narrow, shallow lasing region causes heating in the device which presents particularly difficult thermal management problems. As laser diode brightness requirements increase, so too do the requirements for rejection of waste heat.

A further example may be found in microprocessors. Microprocessors are understood by those skilled in the art to comprise integrated circuits composed of multiple transistors which control the flow of electrons so as to effect computation in a useful fashion. At this writing, microprocessors are primarily fabricated using silicon both as the electronically active elements (transistors) and as the mechanical support material for those elements. This is commonly done by fabricating transistors on the surface of a silicon wafer, the transistor structures being thin compared with the bulk of the wafer thickness underlying the active device layers. It will be appreciated that although reference is made in this discussion to silicon integrated circuits such as microprocessors, this is not intended by way of limitation with regard to the material used to fabricate such devices, and other materials such as germanium, gallium arsenide, gallium aluminum arsenide, and gallium nitride are included without limitation.

Microprocessors, like other electronic devices, generate heat as a consequence of operation. Owing to the physics underlying its construction, a microprocessor generates more heat the more rapidly it is made to operate. Thus, as microprocessors are made to provide higher clock rates (an index of the speed with which the transistors in the processor are made to switch on and off, which is the basis for their computational functions), they generate greater heat which must be disposed of to maintain the microprocessor temperature within its safe operating limits.

Microprocessors present particularly difficult thermal management problems. They are composed of millions of transistors and their heat generation rates depend on their clock speeds and the particular software codes they execute, among other parameters. In addition, their temperature or thermal profiles are often nonuniform. That is, certain areas of the processor will be hotter than others, and these hot spots will limit the overall performance of the device, even though other regions are operating well within their thermal limits and could be operated faster but for the hot spot regions.

In common practice, microprocessors are mechanically constrained by a package, which consists of components that support and position the processor in space, provide electrical connections, allow for the transference of waste heat away from the device, and provide the requisite degree of mechanical integrity and isolation from environmental degradation. It will be appreciated by those skilled in the art that these requirements are often in opposition and pose difficult engineering tradeoffs to the package designer. Once a processor has been packaged, it is often affixed to a circuit board whereby it interfaces with other integrated circuits such as memory, buss management chips, or other integrated circuits that co-operate with the processor in its operation.

There are many ways to package microprocessors. For processors that have significant thermal rejection requirements, a critical element of their packaging is the component through which heat from the processor first passes on its way to the ultimate heat-dissipation modality in the system. This component, being the first element in the chain of transport of waste heat away from the processor, greatly affects the efficiency of heat transport, and is subject to a variety of conflicting requirements that, taken together, strongly constrain the choice of materials that can be used to fabricate the component. The component is often called a heat spreader, and is usually bonded to the processor by means of thermally conductive adhesive, or solder, or by use of mechanical compression or other means of affixing it in intimate contact to the processor. It should be noted that the designation "heat spreader" is a convenience for discussion of the package component and not a limiting designation.

Figure 1:
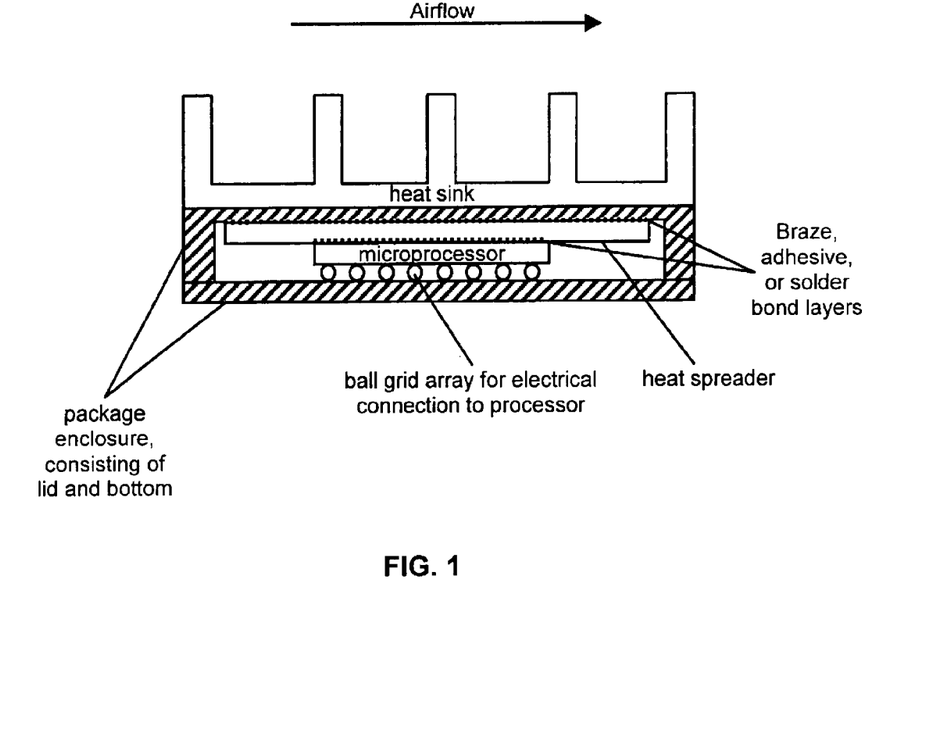
FIG. 1 is a schematic representation showing a common configuration of a heat-generating device in the form of a microprocessor, heat spreader, and overall package.

Referring now to FIG. 1, a schematic representation shows a common configuration of a microprocessor, heat spreader, and overall package. The figure shows a "BGA (Ball Grid Array) package", a configuration in which a microprocessor is mounted on an array of small solder spheres that primarily provide electrical contact to the microprocessor. They also lend a degree of mechanical support and thermal conduction, although the latter is relatively low because the thermal conductivity of solder alloys is poor and the total surface area available for thermal conduction is small compared to the area of the microprocessor.

The principal thermal pathway in this configuration is out the back of the microprocessor, through the heat spreader, through the package lid, and into the heat sink, from which heat is extracted, often by a moving fluid, for dispersal to the environment. Although this figure represents one particular configuration of microprocessor package, it is representative of most others in depicting the need for a high thermal conductivity pathway through which to reject heat produced during operation.

The package component, or heat spreader, immediately adjacent to the microprocessor must exhibit high thermal conductivity to facilitate the transport of heat away from the processor. It must also possess a thermal expansion coefficient that is sufficiently similar to that of the processor material to avoid exerting destructive forces on the processor which arise out of the differential thermal expansion of the processor and heat spreader. It must also be capable of supporting an intimate bond with the processor through adhesive, solder, or other means. If needed, it must provide electrical isolation without detriment to thermal transfer. These requirements are mutually conflicting, and have not heretofore been susceptible of a particularly favorable solution.

Materials to date used for microprocessor heat spreaders have been selected from metals and metal alloys such as copper/tungsten or copper/molybdenum. Certain ceramic materials, such as beryllium oxide or aluminum nitride have also been used as heat spreaders for electronic devices. These materials are characterized by having thermal conductivities in the range of approximately 1 to approximately 3 watts/centimeter/degree Centigrade (hereafter W/cm/° C.). For reference, pure copper has a thermal conductivity of approximately 4 W/cm/° C.

It will be immediately appreciated by those skilled in the art that the materials in common use for heat spreaders in microprocessor packaging exhibit lower thermal conductivity by far than a commonly available metal, copper, which would otherwise be a better choice of material for the requirement. Copper, however, has a thermal expansion coefficient much greater than that of silicon, and cannot be used in direct proximity with a silicon device due to the high probability of fracture of the silicon as a result of differential thermal expansion during operation. For comparison, silicon has a thermal expansion coefficient of approximately 4.1 parts per million per degree Centigrade, while copper, copper/tungsten alloy, beryllium oxide, and aluminum nitride are respectively approximately 17, 5.6–7, 8, and 4.5, in the same units. Aluminum nitride provides a good thermal expansion match to silicon, but its thermal conductivity is only about 1.7 W/cm/° C. Most designers therefore select copper/tungsten alloys because they are less costly than aluminum nitride and provide similar thermal conductivity.

The problem of thermal expansion becomes more severe as the size of the microprocessor or other electronic device increases. Because differential expansion forces arise over the entire extent of the interface between heat spreader and microprocessor, the larger the interface, the greater the total force exerted on the processor, and the higher the probability of fracture of the processor material. For purposes of this disclosure, we intend to cover electronic devices, including microprocessors, having a surface area in contact with the heat spreader or other first package element of one square centimeter or greater.

As a result of differential expansion forces, package designers have been forced to employ materials of inferior thermal conductivity as heat spreaders in device packages. This in turn has limited the ability to transport waste heat away from microprocessors, constraining their performance to a substantial and unacceptable degree.

It has long been known that diamond is an ideal potential candidate for heat transfer applications such as described above. Diamond, both natural and synthetic, is known in the art to exhibit thermal conductivity superior to all other known materials. Diamond manufactured by chemical vapor deposition, a modern and widely studied means of diamond synthesis, has been shown to exhibit thermal conductivity in excess of 20 W/cm/° C. At the same time, diamond's thermal expansion coefficient is approximately 1 to $1.7 \times 10^{-6}$/° C. over the operating temperature range of silicon-based microprocessors. Finally, diamond has the highest Young's modulus, or stiffness, of any known material, excluding unidirectional modulii of certain fibers not applicable to the present invention. The combination of these properties is unique to diamond.

It has not been previously possible, however, to provide diamond material for use in such applications at a price that permits their commercial use. Integrated circuits such as microprocessors are fabricated on integrated circuit dice having areas of 1 square centimeter or larger. Use of diamond material for heat transfer from such devices having areas as large as 1 square centimeter or larger has been, at best, a laboratory curiosity because of the prohibitively high expense of providing the diamond material.

Diamond synthesis through chemical vapor deposition (CVD) is by now a well-established art. Commercial diamond deposition systems are available and products employing CVD diamond are routinely sold for commercial applications ranging from cutting tools to heat spreaders.

All diamond CVD processes to date have been characterized by very low process efficiency in terms of the amount of diamond produced in response to consumption of energy and synthesis materials. There has been a long-felt need within the CVD diamond industry to improve diamond CVD process efficiencies. This long felt need has given rise to vigorous prior but unsuccessful efforts to achieve significantly higher process efficiencies.

Diamond chemical vapor deposition is accomplished by energizing an appropriate gas mixture (most commonly containing a preponderance of hydrogen and a minor hydrocarbon constituent, the latter being the source of carbon which is deposited as diamond) in a suitable deposition reactor and providing means for the diamond precursor chemical specie(s) generated by said application of energy to encounter a surface whose temperature, chemistry, and surface preparation properties permit the nucleation and growth of diamond layers in a manner well-known to those skilled in the art.

It is thought, and there is considerable supporting and little contradicting evidence, that a key step in the formation of diamond through the majority of useful diamond CVD processes is the dissociation of ordinary molecular hydrogen gas to form atomic hydrogen. Once formed, this species effects several actions known to be required for diamond CVD to occur at useful rates: it stabilizes carbon in the sp3 (diamond) bonding configuration and forestalls the formation of undesirable sp2 (graphitic) bonds; it abstracts hydrogen from hydrocarbon precursor species and thereby makes carbon available for incorporation in the growing diamond lattice; and it selectively reacts with, and returns to the gas phase, those small graphitic domains which may from time to time appear during the diamond CVD process, thereby preventing the formation of graphite-contaminated diamond which would be of no significant utility.

While the details of surface chemistry underlying diamond CVD remain to some degree obscure, it is widely observed that the successful synthesis of diamond through most CVD methods requires production of atomic hydrogen. The economics of diamond CVD processes are essentially the economics of generating atomic hydrogen.

A few instances of diamond CVD requiring little or no atomic hydrogen are known to the art. A laser-driven diamond CVD process developed by QQC, Inc., appears not to require hydrogen in its precursor atmosphere. Similarly, diamond CVD using microwave-assisted plasmas has been accomplished under conditions of reduced hydrogen concentration. While these results suggest subtleties to diamond CVD chemistry that remain to be elucidated, they confirm the fundamental scheme in which a gas, or mixture of gases, is energized by a variety of modalities to effect diamond CVD under appropriate conditions as specifically required by the circumstances chosen by the practitioner of the art. To date, none of the low-hydrogen diamond CVD processes has demonstrated commercial utility.

In all known diamond CVD processes having commercial utility, production of atomic hydrogen is required and is the primary energy-consuming step in those processes. The costs of producing atomic hydrogen in large quantities are considerable, and include the direct cost of energy as well as the cost of equipment needed to apply that energy in a useful manner. As will be seen, the diamond CVD processes that constitute the current art are extremely inefficient, leading to very high energy and equipment costs.

The heart of diamond CVD process inefficiency lies in the short lifetime of the atomic hydrogen species and in the energy cost of creating that species. Atomic hydrogen is thermodynamically driven to recombine to form molecular hydrogen, which plays no significant role in diamond CVD. The recombination, or loss, of atomic hydrogen proceeds very rapidly on surfaces and comparatively slowly in the gas phase. This relationship arises because recombination of two hydrogen atoms requires a release of energy in order to proceed. In the gas phase, quantum mechanical effects prohibit the release of the recombination energy when only two hydrogen atoms collide. Thus, gas-phase recombination of atomic hydrogen requires simultaneous collision of at least three bodies, two of which are hydrogen atoms. The third body, which may be another hydrogen atom, molecule, or non-hydrogen molecule, dissipates the recombination energy as kinetic energy.

On surfaces, the required kinetic energy dissipation pathway is provided by the surface itself. The recombination of atomic hydrogen on surfaces is a two-body collision because of this, and it proceeds very rapidly compared to gas phase recombination. The recombination energy appears as heat in the substrate. Much of the substrate heating observed in diamond deposition arises from the energy of atomic hydrogen recombination.

Because the manufacture of atomic hydrogen requires substantial energy, and because the species, once made, is continuously and rapidly destroyed by recombination with itself and with other molecular species, successful diamond CVD requires manufacture of enormous amounts of atomic hydrogen compared with the amounts which actually participate in diamond deposition. This is the root of the inefficiency of current diamond CVD art.

A common feature of nearly all diamond CVD processes is the manufacture of atomic hydrogen at distances relatively remote from the deposition region. Thus, microwave diamond CVD entails the formation of microwave plasma regions, the main bulk of which do not contact the deposition surface and which may be several inches away from that surface. This provides ample opportunity for loss of valuable atomic hydrogen through recombination.

Similarly, diamond CVD practiced with heated filaments suffers from relative inefficiency of atomic hydrogen production (due to limits on filament temperature) as well as losses due to the inability to locate filaments in immediate proximity to the deposition surface, which limitation arises from substrate overheating due to radiation of energy from the filament.

A third common means of diamond CVD, use of electrically-driven plasma torches which manufacture atomic hydrogen principally through superheating a stream of molecular hydrogen, must transport manufactured atomic hydrogen in a supersonic stream from the energy application point to the deposition region, which is typically at least several inches away. Much atomic hydrogen is lost, but because the supersonic gas stream impacts the substrate at high velocity, stagnation boundary layers are thin, and the diffusive flux of atomic hydrogen to the surface is relatively large, giving high growth rates for this method. Overall efficiency, however, remains poor, because of the enormous overproduction of atomic hydrogen inherent in the process compared with the small fraction that reaches the growth surface.

Diamond CVD growth efficiency is often expressed in terms of the weight of diamond formed per unit time as a function of the amount of power supplied to the system. While this figure of merit ignores the consumption of precursor gases, it is a useful index of the energy efficiency of a diamond CVD process and makes possible an efficiency comparison among different diamond CVD processes. A more comprehensive index of diamond growth efficiency will be presented below.

As reported (MRS Bulletin, September 1998, volume 23, no. 9, pp 22–27, in particular FIG. 3 on page 24), the best diamond CVD processes have reached a power efficiency of approximately 6.25 kilowatts (kW) per hour per carat of diamond deposited. A carat is equal to 0.2 grams. As reported in this reference, this efficiency level has been reached by application of successively greater amounts of power to the growth system, reaching up to 200 kW in some systems.

Unfortunately, the capital cost of equipment capable of sustaining such extremely energetic processes is large. Thus, the modest increase in deposition efficiency gained by use of more power is offset by the resultant economic penalty. The net result of this technology development pathway has been an increase in diamond deposition rate without significant decrease in deposition cost. Breakout from the constrained high cost of diamond synthesis has been a long-sought goal in the art.

A more useful diamond CVD growth efficiency index should account for consumption of gases as well as energy use. In the same manner that energy consumption can be expressed in terms of kilowatt-hours per carat of diamond produced, hydrogen and methane consumption can be expressed in terms of standard liters per carat of diamond produced. If gas consumption in standard liters of hydrogen and methane per carat of diamond produced is added to electrical power consumption in kilowatt-hours per carat of diamond produced, and the inverse of that sum is computed, an index results that correctly reflects diamond CVD process efficiency by varying inversely with energy and gas consumption rates. This index, referred to herein as the "raw composite growth efficiency" makes it possible to compare the growth efficiencies of disparate diamond CVD processes.

Process efficiencies for the principal means of diamond CVD are shown in Table 1. The data have been compiled from literature reports and from experience with each of the listed modalities. Energy efficiency is expressed in terms of kW-Hr/carat of diamond produced, while raw material consumption is expressed as liters of gas consumed per carat of diamond produced. Raw composite growth and normalized composite growth efficiencies are calculated as stated above, and are presented with the efficiency of the arc jet modality normalized to 100%.

TABLE 1

Comparative Diamond CVD Process Efficiencies

|  | Arc Jet | Hot Filament | Microwave | Current Invention |
|---|---|---|---|---|
| Power consumption, KW-Hr/carat | 6.8 | 44.6 | 34.1 | 2.1 |
| Hydrogen consumption, standard liters/carat | 2,048 | 669 | 546 | 86 |
| Methane consumption, standard liters/carat | 102.4 | 33.4 | 27.3 | 4.3 |
| Raw composite growth efficiency | 0.000464 | 0.00134 | 0.00165 | 0.00792 |
| Normalized composite growth Efficiency | 100% | 289% | 355% | 1,700% |

The foregoing table discloses the relative growth efficiencies of diamond CVD methods, including that achieved by this invention. No diamond deposition method, other than this invention, is known to produce diamond at a raw composite growth efficiency greater than approximately 0.00165 as computed according to the method shown above. These growth efficiencies are understood to be in reference to CVD diamond material of commercially useful purity. One means of establishing purity of a CVD diamond material, and a means commonly employed in the art, is through use of Raman spectroscopy. So measured, the Raman signature of commercially useful CVD diamond shows an $sp^3$ (diamond-bonded carbon) peak having a full width at half maximum value of 12 wavenumbers or less, and exhibits non-$sp^3$ features of intensity less than 50% of the $sp^3$ peak intensity in the wavenumber region from 1200 $cm^{-1}$ to 1700 $cm^{-1}$.

BRIEF DESCRIPTION OF THE INVENTION

The present invention provides a superior solution for transport of waste heat away from microprocessors or other electronic devices without generating destructive interface forces. The present invention employs high-efficiency diamond as the material for the heat spreader in intimate contact with the microprocessor or other heat generating electronic device.

The diamond employed in the present invention is deposited using a process having greatly enhanced growth efficiency and is thus cost effective to employ for the purposes set forth herein. Diamond materials employed in the present invention are referred to herein as "high-efficiency" diamond materials. That term, as used herein, shall be used to identify diamond material having a composite growth efficiency greater than about 0.003.

According to one embodiment of a method according to the present invention, atomic hydrogen and other requisite diamond deposition species are generated in intimate proximity to the deposition surface, thereby greatly reducing the amount of atomic hydrogen and other precursors lost to the process, and concurrently greatly reducing the amount of energy and precursor material required to achieve a given diamond deposition rate.

According to another embodiment of a method according to the present invention, atomic hydrogen and other requisite diamond deposition species are generated at pressures greater than 20 Torr using plasmas excited at powered electrodes from energies at frequencies greater than 50 MHz.

Methods for cooling heat-generating devices, such as electronic devices and, in particular, semiconductor devices, according to the present invention comprise growing high-efficiency diamond material and thermally coupling the high-efficiency diamond material to the heat-generating devices. The high-efficiency diamond material may also be thermally coupled to heat spreaders or sinks for dissapation of the heat conducted away from the heat-generating devices.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

The present invention comprises the use of a high-efficiency diamond material as a component interposed between a heat source and heat sink as part of a thermal transport or thermal management system. This invention makes particular reference to use of diamond materials with integrated circuits, including microprocessors, and other elements of their supporting packages.

Figure 2:
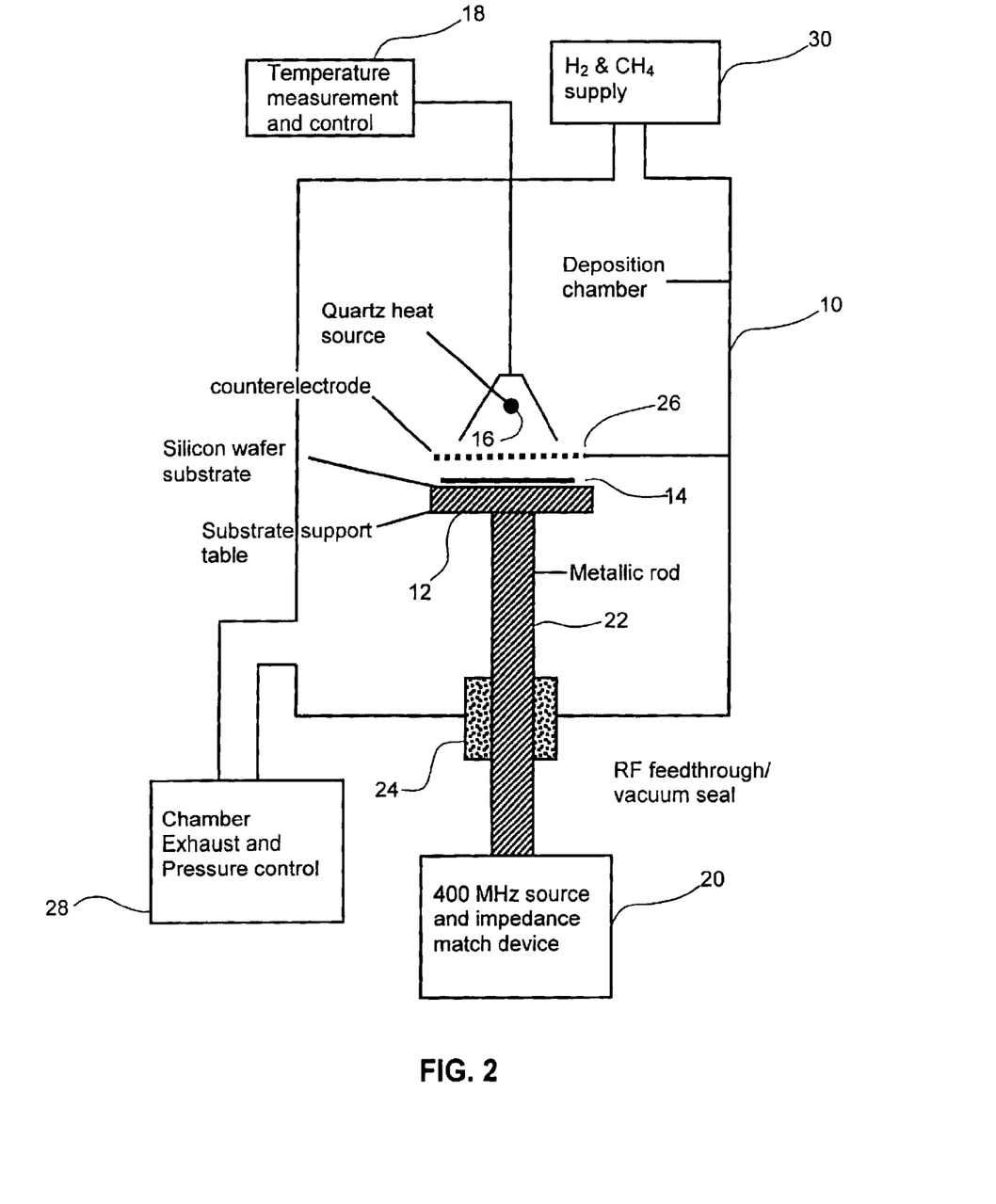
FIG. 2 is a schematic representation of a first exemplary process according to the present invention for synthesizing high-efficiency diamond material.

Referring now to FIG. 2, a schematic representation illustrates a first actual exemplary process according to the present invention for synthesizing high-efficiency diamond material for use in the present invention.

Specifically, the process illustrated in FIG. 2 employs a chamber 10 affording a controlled atmosphere and pressure, wherein is disposed a substrate support 12 for supporting a substrate 14 on which it is desired to deposit diamond. A heat source 16 and temperature measurement and control system 18 are employed whereby the temperature of the deposition substrate may be controlled within a range known to those skilled in the art to support diamond growth. A signal source 20 generates energy in the form of alternating current having a frequency greater than approximately 50 MHz may be applied to the substrate support structure in such a way as to cause a high electric field to appear at the deposition substrate surface in order to cause the electrical breakdown of gases immediately adjacent to that surface with the formation of a plasma near the deposition substrate surface.

More specifically, an actual embodiment of this invention employs a metallic rod 22 suitable for the conduction of electrical energy at 400 MHz. The rod is fixed at its base through an electrically nonconductive support 24 that provides mechanical stability and allows the structure to be energized with 400 MHz energy. The rod is approximately 6 inches in overall length and is oriented substantially vertically, although this orientation is not critical to the operation of methods according to the present invention. At the unfixed end of the rod, a disc having a diameter of approximately 1 inch and a thickness of approximately 1/8" is attached to the rod to form substrate support 12 at the end of the rod suitable for the support of a silicon wafer or other suitable substrate on which it is desired to grow a diamond coating. This disc and rod are fabricated from materials compatible with the environment required for diamond deposition as is known in the art. Molybdenum is a suitable material among others known in the art.

As shown in FIG. 2, energy at 400 MHz is admitted into the deposition chamber and applied to the base of the above-described rod/support structure such that the rod 22 and support 12 form an electrical quarter-wave component well-known to those skilled in the art and designated herein as the powered electrode. A characteristic of such a structure when energized in the manner described is the appearance of high electrical fields at the end of the structure distant from the end at which the energy is applied. In this case, the electric field is highest at the disc which supports the deposition substrate. This provides the energy needed to achieve electrical breakdown of the gases contained within the growth chamber and cause the formation of a plasma adjacent to the deposition substrate surface, as will be detailed further below. The 400 MHz electrical energy may be provided by radio-frequency generator 20 that embodies controllable power output, a coaxial cable for transmitting energy from the generator, an electrical impedance matching device to accomplish efficient coupling of energy from the generator to the powered electrode structure, and equipment for monitoring the amounts of incident and reflected energy in the system, not shown but well known to persons of ordinary skill in the art.

A counter electrode, 26 formed from a molybdenum screen in the shape of a disc having a diameter of about one inch, consisting of molybdenum wire having a wire gauge of approximately 16 and a wire/inch weave of approximately 16, is supported parallel to, and spaced approximately 0.5 inch away from, the exposed face of the substrate support disc. This counter electrode 26 is connected to electrical ground (sown as the chamber wall in FIG. 2) and assists in the concentration of electric fields at the deposition substrate 14, thereby facilitating the breakdown of gas and formation of plasma in the desired region. While the counter electrode 26 is a convenient adjunct to the invention, reducing the criticality of the dimensions of the powered electrode, the present invention is operative without such an electrode.

Quartz-halogen radiant heating lamp 16 of a type well-known in the art, commonly used and herein employed to adjust the temperature of the deposition substrate to the desired value prior to plasma ignition is placed behind the molybdenum screen counterelectrode 26. Radiant energy proceeds from the quartz heating lamp through the molybdenum screen counter electrode 26 and impinges on the deposition substrate 14, causing its temperature to increase. The deposition substrate temperature is monitored, and the quartz heating lamp is controlled so as to achieve and maintain the desired temperature at the deposition substrate 14. It will be apparent to those skilled in the art that this controlled heating system may be altered or replaced by any of a number of other well-known means for achieving substrate temperature control, including resistive radiant heating, resistive direct heating, induction heating, and control of substrate heating by control of the power applied to achieve plasma formation.

A silicon wafer common in the industry having a diameter of about 1 inch and a thickness of about 0.5 mm which has been prepared for diamond deposition by nucleation enhancement means well-known to the art (in this case, minor abrasion with 1 micron diamond abrasive) is employed as substrate 14 and is placed on the powered electrode facing the counter electrode. The deposition chamber 10 is closed, and gases are evacuated from the chamber by means of a vacuum pump included in chamber exhaust and pressure control 28. When a pressure of 0.01 Torr or less has been achieved, gases suitable for diamond deposition are admitted to the chamber until the pressure is about 5 Torr, at which pressure the atmosphere is maintained by means of a pressure transducer, a pressure controller, and a controlled valve in the chamber gas exhaust line included (but not shown) in chamber exhaust and pressure control 28, all configured in a manner well understood by persons of ordinary skill in the art. A suitable gas mixture and flow rate has been found to be 200 standard cubic centimeters per minute (sccm) of hydrogen and 10 sccm of methane from gas supply 30, each gas having a purity level of not less than 99.999%. Other gas compositions known to the art of diamond CVD are operable, and this particular mixture is specified as illustrative and operable without limitation thereto.

The quartz heating lamp 16 is energized to bring the deposition substrate 14 (the silicon wafer) to the desired temperature, in this case about 750 degrees Centigrade. This temperature is within the broad range of temperatures known to support diamond CVD and is specified without exclusion of other suitable temperatures known in the diamond deposition art. 400 MHz energy is then applied to the powered electrode to cause the ignition of a plasma between the powered electrode and the counter electrode. It has been commonly observed that plasma ignition occurs when at least 50 watts of energy is applied. When plasma ignition has been achieved, the chamber pressure control system is manipulated to cause a slow (typically 10 torr/minute) increase in pressure to the deposition pressure of 100 Torr. During this pressure increase, the 400 MHz energy source is controlled to increase the amount of applied energy to sustain the plasma between the powered electrode and the counter electrode. As the pressure is increased, 400 MHz energy is delivered in increasing amounts and contributes to substrate heating. Accordingly, the quartz heating lamp 16 is automatically controlled to maintain substrate temperature at approximately 750 degrees Centigrade. While the particular power required to sustain the plasma will vary with the details of each individual apparatus, it has been observed that about 200 watts of 400 MHz energy is adequate to sustain a plasma as described at a pressure of about 100 Torr.

As the chamber gas pressure increases from 5 Torr to 100 Torr and additional 400 MHz energy is applied, it is observed that the plasma maintains its diameter of approximately 1 inch but shrinks from the space between the two electrodes to form thin plasma regions or "skins" on each of the powered electrode and the counter electrode. Measurements have shown that at 100 Torr, the plasma on the powered electrode has a thickness of approximately 2 mm, and is so intimately adjacent to the deposition substrate surface that it is difficult to determine the distance between the surface and the plasma, the distance being less than 1 mm. This relationship is completely novel in the art of diamond CVD and underlies the efficacy of this invention.

After maintaining deposition at 200 watts of applied energy for 3 hours, all energy inputs to the process are shut off and the apparatus is allowed to cool to room temperature. The chamber 10 is evacuated and filled with air. The chamber 10 is opened and a diamond layer is found to have grown on the deposition substrate 14 to a thickness of approximately 84 microns. This represents a deposition power efficiency of approximately 0.8 KwHr/carat, approximately 7.8 times (780%) as efficient as the known state-of-the-art maximum of 6.26 KwHr/carat. The raw composite growth efficiency is 0.00792. Diamond growth is also noted on the counterelectrode 26, the thickness being less than that noted on the powered electrode. Diamond growth on the counterelectrode 26 has been omitted from the efficiency calculation, rendering that calculation conservative. The present invention contemplates reactors designed so as to make use of the diamond material grown on counterelectrode structures to provide enhanced utility.

Figure 3:
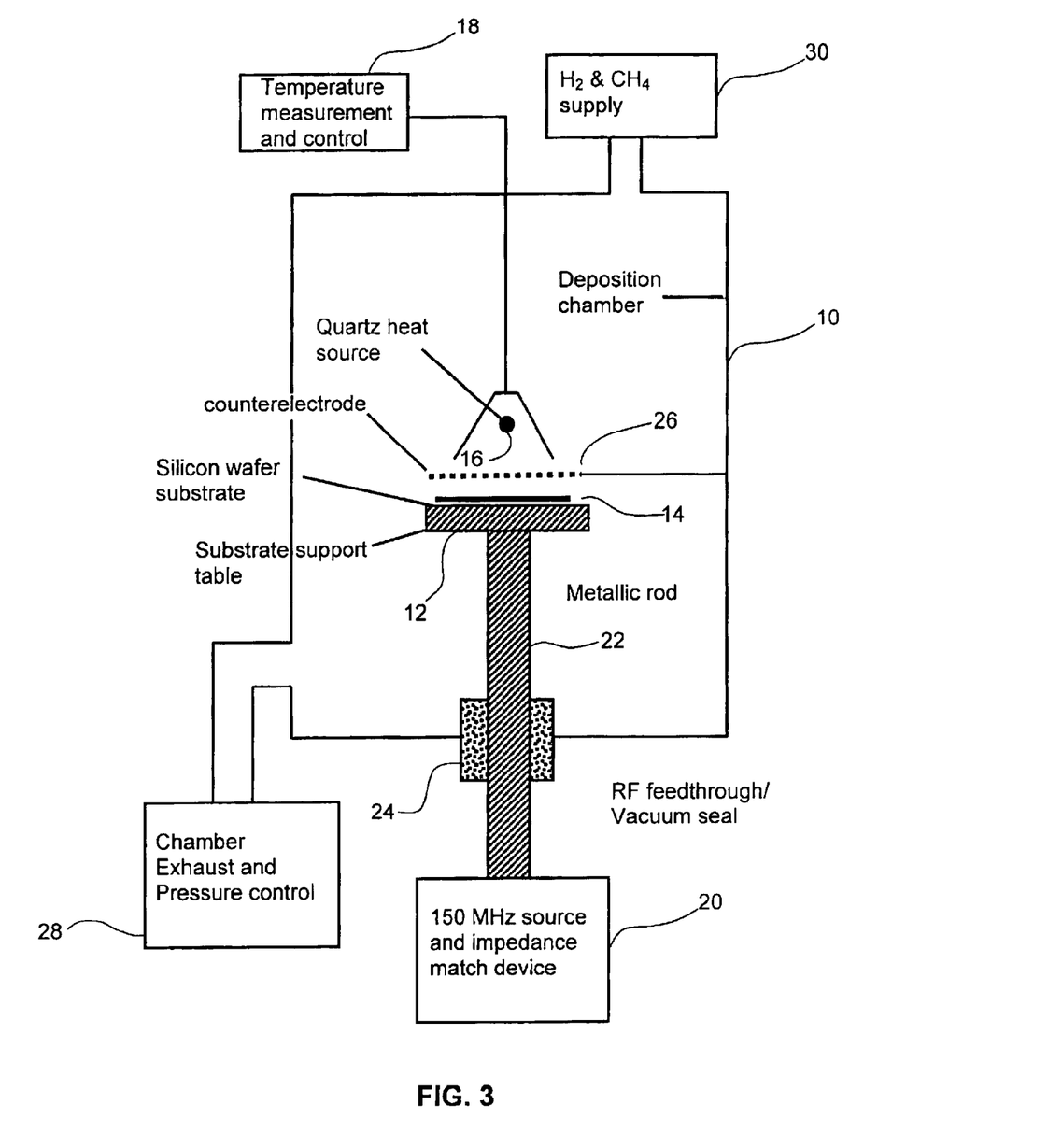
FIG. 3 is a schematic representation of a second exemplary process according to the present invention for synthesizing high-efficiency diamond material.

Another actual exemplary process according to the present invention is shown with reference to FIG. 3. Because the apparatus for performing the process described with reference to FIG. 3 is similar in nature to the apparatus shown in FIG. 2, elements in FIG. 3 which correspond to elements in FIG. 2 will be designated by the same reference numerals used in FIG. 2.

Accordingly, a suitable metallic deposition chamber 10 is provided having a chamber exhaust and pressure control system 28 for control of atmospheric pressure and composition. As in the embodiment discussed previously, the rod 22 and substrate support 12 are provided for supporting and energizing a deposition substrate 14. The temperature of the deposition substrate 14 may be measured and controlled as in the previous embodiment by temperature measurement and control system 18. Energy of a frequency of approximately 150 MHz is applied from a generator source to the structure holding the substrate and thereby to the substrate itself. Substrate 14, comprising a silicon wafer 8 inches in diameter treated for diamond nucleation by means well-known in the art, is placed on the rod 22 and support 12 or other structure suitable for holding such a wafer and fabricated from a material compatible with the requirements of diamond chemical vapor deposition. One such material is molybdenum, with others being tungsten, silicon carbide, silicon nitride, or others known to the art. A counterelectrode 26 having a disc geometry with a diameter of approximately 8.50 inches is disposed in opposition to the substrate 14, and is separated from the substrate surface by approximately 0.25".

The deposition chamber 10 is evacuated to a base pressure of less than 0.01 Torr and process gases consisting of hydrogen and methane are admitted to the deposition chamber from gas supply 30 at a mixture ratio of 95% hydrogen, 5% methane, and the chamber pressure is regulated at 5 Torr. When 5 Torr pressure is reached, the 150 MHz source is energized and a plasma is observed to cover both the deposition substrate 14 and the counterelectrode 26, and to fill the space in between these two structures.

Chamber pressure is slowly increased to 150 Torr, with concurrent increase in the power level of the 150 MHz source, and with concurrent adjustments of the impedance matching device (not shown) to maintain a good electrical match between the power source 20 and the deposition system. As pressure increases, the plasma is observed to fade from the interelectrode space and to persist as a thin structure on the deposition substrate 14 and on the immediately opposed surface of counterelectrode 26. At a pressure of 150 Torr, approximately 75 kW of 150 MHz energy is required to maintain a uniform plasma over the deposition substrate 14.

After a duration of seven hours, the deposition system is shut off, and allowed to cool. A diamond film is observed to have grown over the silicon deposition substrate to a thickness of approximately 120 microns. The power deposition efficiency is calculated to be 1.4 kWHr/carat of diamond deposited. The raw composite growth efficiency is 0.00832. The normalized composite growth efficiency is calculated to be approximately 17.6 times, or 1780%, of the efficiency of the 100% reference growth efficiency of the arc jet method.

Presentation of the foregoing illustrative embodiments is not by way of restriction to those methods. For example, numerous extensions are contemplated of those embodiments in which energy is provided through application of one or a combination of two or more other sources such as lasers or other illumination sources, electromagnetic radiation outside the visible spectrum, radiation from nuclear sources, pressure or shock waves, thermal energy, energy from chemical reactions, etc. Processes in which reactants are supplied to the atmosphere to which energy is supplied by through phase change(s) from liquid to vapor, or from solid to vapor, or by finely subdividing reactants in the solid or liquid form in order to disperse them in the growth atmosphere are also contemplated according to the present invention.

Following synthesis of raw diamond material, manufacturing finished diamond materials may be achieved through use of techniques such as laser cutting to achieve the requisite shape and dimensions, mechanical grinding and polishing to produce the required thickness, flatness, parallelism, and surface finish, and sputtering and/or physical vapor deposition to deposit those metal coatings that may be needed to support solder or braze attachment between the diamond and other components. These techniques are all well known to those skilled in the art, and are available from a wide range of commercial suppliers of equipment for fabricating ceramic materials.

According to the present invention, a high-efficiency diamond material having a surface area equal to at least the area of the heat source may be employed. Diamond materials having a surface area greater than that of the heat source are specifically contemplated in this invention and provide an additional facilitation of heat transfer due to their greater area.

Figure 4:
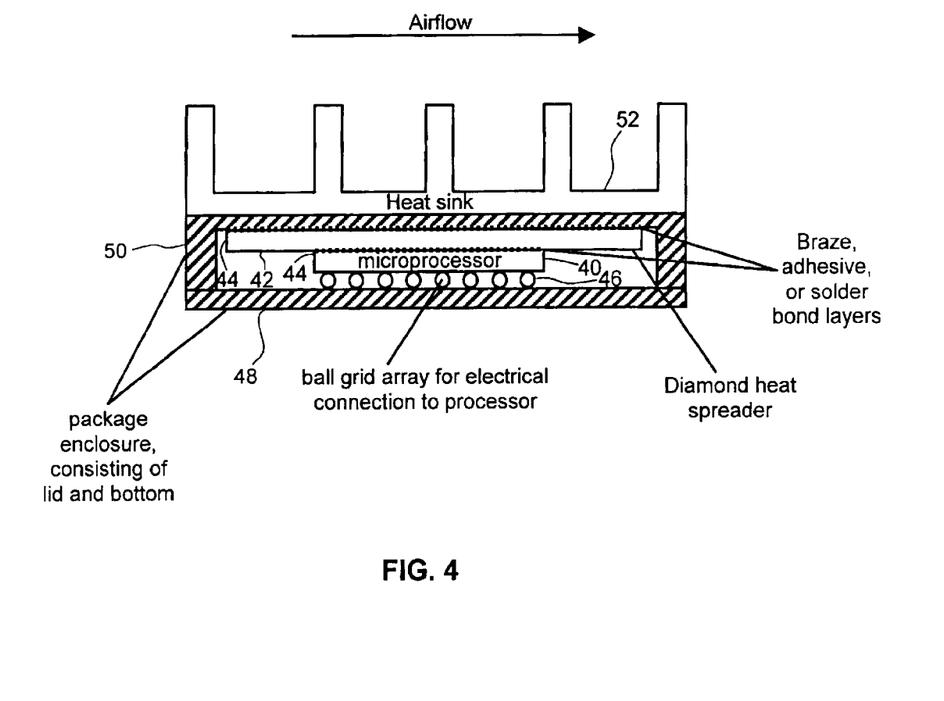
FIG. 4 is a schematic representation showing a heat-generating device in the form of a microprocessor, a heat spreader, and overall package configured according to a first embodiment of the present invention.

As illustrated in FIG. 4, a heat source 40 in the form of a microprocessor die and a high-efficiency diamond material 42 according to the present invention may be constructed by providing a thermal interface 44 using standard soldering, brazing, and/or adhesive bonding that provide a sound mechanical and thermal bond between the heat source and the diamond. These effect a good thermal transfer interface, and bond the heat source and high-efficiency diamond material mechanically with a bond strength dependent on the particular attachment technology employed. Thus, microprocessor die 40 employs ball grid array 46 to make electrical connections to package bottom 48. A first surface of high-efficiency diamond material 42 is mechanically bonded to microprocessor die 40 and a second surface of high-efficiency diamond material 42 is mechanically bonded to package lid 50. Also shown in FIG. 4 is heat sink 52 thermally coupled to package lid 50. Persons of ordinary skill in the art will readily appreciate that the illustration of FIG. 4 is exemplary only and is not intended to be limited to the particular packaging scheme there shown.

The bonded mechanical interface illustrated in FIG. 4 gives rise to generation of shear forces at the interface if the heat source has a different coefficient of thermal expansion than that of diamond. The sign and magnitude of this interface force will depend on the difference in thermal expansion coefficient values, and on the degree of heating or cooling above or below the temperature at which the bond was made.

Figure 5:
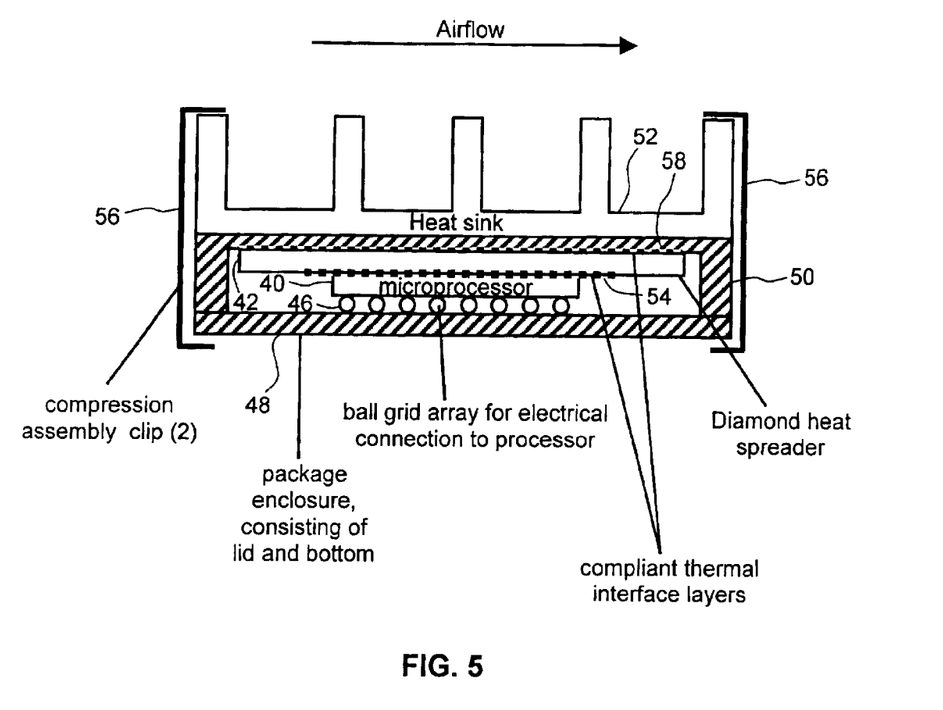
FIG. 5 is a schematic representation showing a heat-generating device in the form of a microprocessor, a heat spreader, and overall package configured according to a second embodiment of the present invention.

As shown by example in FIG. 5, a similarly useful thermal interface may be achieved without mechanical bonding through interposition of a thin, low-friction, thermally-conductive compliant material between the heat source (microprocessor die 40) and the high-efficiency diamond material 42. In FIG. 5, microprocessor die 40 employs ball grid array 46 to make electrical connections to package bottom 46. A first layer 54 of a thin, low-friction, thermally-conductive compliant material is disposed between first surface of high-efficiency diamond material 42 and microprocessor die 40.

The thin, low-friction, thermally-conductive compliant material layer 54 may comprise, for example, thin sheets of flexible graphite (available commercially under the trade name Grafoil). This layer 54 is interposed and compressed into intimate contact with the heat source 40 and the high-efficiency diamond material 42 through use of common spring clip 56 (two shown) or other mechanical mounting scheme that provides a suitable level of compressive force. Persons of ordinary skill in the art will appreciate that a second layer 58 of the thin, low friction, thermally conductive compliant material may also be employed between the high-efficiency diamond material 42 and the package lid 50 in other embodiments of the present invention as also shown in FIG. 5. Also shown in FIG. 4 is heat sink 52 thermally coupled to package lid 50. As with FIG. 4, persons of ordinary skill in the art will also readily appreciate that the illustration of FIG. 5 is exemplary only and is not intended to be limited to the particular packaging scheme there shown.

The advantage of the embodiment of FIG. 5 for effecting a thermal interface is that it provides a means for transmitting heat without also transmitting significant mechanical shear force. Therefore, a heat source with a thermal expansion coefficient different from that of diamond can be employed without generation of large mismatch forces at the interface. This is an important advantage for using diamond materials in packaging electronic devices made from silicon, gallium arsenide, and/or other device materials that possess expansion coefficients different from diamond and that are fragile and susceptible to breakage through interface shear force.

The thickness of the high-efficiency diamond material will necessarily vary in accord with the specific geometry of the heat source to which it is affixed. In this embodiment, the high-efficiency diamond material thickness lies between 100 microns and 2000 microns, preferably between 300 microns and 800 microns. As is readily understood by persons of ordinary skill in the art, the particular thickness to be most advantageously employed may be determined through modeling of the thermal characteristics of the heat source, the high-efficiency diamond material, and the remainder of the heat transport system.

Several advantageous aspects of the present invention will be readily apprehended by those skilled in the art. First, the use of diamond, with its superior thermal conductivity, enhances the transfer of heat from the heat source to a degree not achievable through use of non-diamond materials. Second, the close matching of the thermal expansion coefficients of diamond and silicon minimizes the forces generated at the interface between the microprocessor heat source and the high-efficiency diamond material. Third, diamond's extreme stiffness resists deformation, and the high-efficiency diamond material thereby mechanically isolates the heat source from interface stresses generated at the side of the high-efficiency diamond material distant from the heat source. This in turn means that common materials with good thermal conductivity, such as copper or aluminum, may be attached to one side of the high-efficiency diamond material as part of the heat rejection system without concern for stress-induced failure of the microprocessor attached to the other side of the diamond. This increases the efficiency of heat transport in the system.

In an exemplary embodiment of the present invention, a high-efficiency diamond material measuring 1"×1"×0.3 mm thick is employed, with its major opposed surfaces having been prepared with a series of metals, said metals being applied by sputtering in the sequence and thicknesses of: titanium, 200 Angstroms, platinum, 1000 Angstroms, gold, 10,000 Angstroms, the titanium layer being immediately adjacent to the diamond surface on each major side of the high-efficiency diamond material, in a manner known to those skilled in the art, the objective being to enable the diamond surfaces to accept a metallic solder bond with useful adhesion. Said high-efficiency diamond material is then soldered by one of its major surfaces with a 63/37 tin/lead solder to a mating copper heat sink, said soldered interface covering the entire surface of the high-efficiency diamond material, without regard to such minor defects as may be produced in the soldering attachment process. To the other side of said high-efficiency diamond material is attached by means of an appropriate gold/tin or other compatible eutectic metallic solder, the back side of a silicon microprocessor presenting a surface area on the side to be affixed to the high-efficiency diamond material in excess of 1 square centimeter, but less than 6.45 square centimeters, and having been prepared as needed to accept solder bonding by means well-established in the art of semiconductor device packaging. On further integration of the (heat sink/diamond/microprocessor) assembly with support devices and circuitry needed to enable operation of the microprocessor, it is found that the maximum attainable thermal transport away from the microprocessor has increased by a factor in excess of 100% without detriment to the processor's operational or structural integrity.

Although the preferred embodiment recited above applies to the use of diamond materials in microprocessor packaging, it will be appreciated by those skilled in the art of heat transfer that the invention provides similar advantages in a wide variety of heat transfer applications. Several of these applications will be named and discussed below, without limitation of the invention thereby to those applications.

It is known that diamond's thermal conductivity increases rapidly as its temperature is reduced below room temperature, reaching a peak at approximately 80 degrees Kelvin. The increase in diamond's thermal conductivity at 80 degrees Kelvin compared with its value at 293 degrees Kelvin (nominal room temperature) is approximately 100 times the room temperature value. This permits diamond's advantageous use in cryogenic heat transfer applications. In cooling high performance infrared detectors, it is necessary to transport heat from the detector to a refrigeration mechanism. Thermal conductance between the detector and refrigerator is determined in great part by the materials comprising the thermal pathway. Diamond's superior cryogenic thermal conductivity enables the rapid removal of heat from cooled detectors, enhancing their performance and reducing the power required by the refrigeration system. Large-area (greater than 1 $cm^2$ area) detectors can be cooled most efficiently by use of a suitable diamond thermal conduction component in the refrigeration heat transfer chain.

Heaters are employed to transfer thermal energy to materials. Many such heaters employ conduction as their principal thermal transfer mechanism. A large class of such heaters are used, for example, in heating process fluids. Frequently, it is an important consideration to heat the target fluid as rapidly as possible, without producing localized high temperature regions that would lead to degradation of the target material or the heater.

Use of diamond as a heat spreader in contact with heating elements reduces local thermal variations. This in turn allows more energy to be applied to the heater without exceeding hot spot limits, resulting in faster heating operation, with increased process throughput and improved economics. In addition, diamond's very low chemical reactivity and high hardness provide excellent protection against corrosion and wear of heater elements.

Diamond may be employed in heating applications as a coating over heating elements or as a separate component that is interposed between a heating element and its target material through means well-known to those skilled in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for cooling a semiconductor device having a thermal transfer surface area comprising:
   growing a diamond film on a substrate in a deposition chamber by reacting gases suitable for diamond deposition in a plasma ignited in said deposition chamber, said plasma disposed adjacent to a growth surface of said substrate such that said plasma extends no further than about 5 mm from said growth surface of said substrate;
   removing said diamond film from said substrate; and
   thermally coupling a first surface of said diamond film to said thermal transfer surface area of the semiconductor device.

2. The method of claim 1 wherein growing said diamond film comprises growing a diamond film having an area larger than said thermal transfer surface area of the semiconductor device and further including:
   dividing said diamond film into portions, at least one portion having an area matched to the thermal transfer area of the semiconductor device; and
   wherein thermally coupling a first surface of said diamond film to said thermal transfer surface area of the semiconductor device comprises thermally coupling a first surface of said at least one portion of said diamond film to said thermal transfer surface area of the semiconductor device.

3. The method of claim 1 further including thermally coupling a second surface of said diamond film to a heat sink.

4. The method of claim 1 wherein thermally coupling said first surface of said diamond film to said thermal transfer surface area of the semiconductor device comprises mechanically bonding said first surface of said diamond film to said thermal transfer surface area of said semiconductor device with a bonding material having a thermal conductivity greater than 0.1 W/cm/° K.

5. The method of claim 4 further including mechanically bonding a second surface of said diamond film to a heat sink with a bonding material having a thermal conductivity greater than 0.1 W/cm/° K.

6. The method of claim 1 wherein thermally coupling said first surface of said diamond film to said thermal transfer surface area of the semiconductor device comprises maintaining said first surface of said diamond film and said to said thermal transfer surface area of said semiconductor device in compression against one another.

7. The method of claim 6 further including maintaining a heat sink in compression with a second surface of said diamond film.

8. A method for cooling a semiconductor device having a thermal transfer surface area comprising:
   growing a diamond film on a substrate in a deposition chamber, said diamond film characterized by a composite growth efficiency greater than about 0.003;
   removing said diamond film from said substrate; and
   thermally coupling a first surface of said diamond film to said thermal transfer surface area of the semiconductor device.

9. The method of claim 8 wherein growing said diamond film comprises growing a diamond film having an area larger than said thermal transfer surface area of the semiconductor device and further including:
   dividing said diamond film into portions, at least one portion having an area matched to the thermal transfer area of the semiconductor device; and
   wherein said thermally coupling a first surface of said diamond film to said thermal transfer surface area of the semiconductor device comprises thermally coupling a first surface of said at least one portion of said diamond film to said thermal transfer surface area of the semiconductor device.

10. The method of claim 8 further including thermally coupling a second surface of said diamond film to a heat sink.

11. The method of claim 8 wherein thermally coupling said first surface of said diamond film to said thermal transfer surface area of the semiconductor device comprises mechanically bonding said first surface of said diamond film to said thermal transfer surface area of said semiconductor device with a bonding material having a thermal conductivity greater than 0.1 W/cm/° K.

12. The method of claim 11 further including mechanically bonding a second surface of said diamond film to a heat sink with a bonding material having a thermal conductivity greater than 0.1 W/cm/° K.

13. The method of claim 8 wherein said thermally coupling said first surface of said diamond film to said thermal transfer surface area of the semiconductor device comprises maintaining said first surface of said diamond film and said thermal transfer surface area of said semiconductor device in compression against one another.

14. The method of claim 13 further including maintaining a heat sink in compression with a second surface of said diamond film.

15. A method for cooling a semiconductor device having a thermal transfer surface area comprising:

growing a diamond film on a substrate in a deposition chamber by reacting gases suitable for diamond deposition in a plasma ignited with energy at a frequency greater than 50 MHz and a power of at least 50 watts at a powered electrode in said deposition chamber, said gases maintained at a pressure greater than 20 Torr, said substrate maintained at a temperature greater than about 700° C.;

removing said diamond film from said substrate; and thermally coupling a first surface of said diamond film to said thermal transfer surface area of the semiconductor device.

16. The method of claim 15 wherein said growing said diamond film comprises growing a diamond film having an area larger than said thermal transfer surface area of the semiconductor device and further including:

dividing said diamond film into portions, at least one portion having an area matched to the thermal transfer area of the semiconductor device; and wherein said thermally coupling a first surface of said diamond film to said thermal transfer surface area of the semiconductor device comprises thermally coupling a first surface of said at least one portion of said diamond film to said thermal transfer surface area of the semiconductor device.

17. The method of claim 15 further including thermally coupling a second surface of said diamond film to a heat sink.

18. The method of claim 15 wherein said thermally coupling said first surface of said diamond film to said thermal transfer surface area of the semiconductor device comprises mechanically bonding said first surface of said diamond film to said thermal transfer surface area of said semiconductor device with a bonding material having a thermal conductivity greater than 0.1 W/cm/° K.

19. The method of claim 18 further including mechanically bonding a second surface of said diamond film to a heat sink with a bonding material having a thermal conductivity greater than 0.1 W/cm/° K.

20. The method of claim 15 wherein thermally coupling said first surface of said diamond film to said thermal transfer surface area of the semiconductor device comprises maintaining said first surface of said diamond film and said to said thermal transfer surface area of said semiconductor device in compression against one another.

21. The method of claim 20 further including maintaining a heat sink in compression with a second surface of said diamond film.

* * * * *